Aug. 25, 1970 MORIO ONOE ET AL 3,525,884

ELECTROMECHANICAL VIBRATING DEVICES

Filed Dec. 23, 1968

INVENTORS
Morio Onoe
Takeshi Yano
BY
Marn & Jangarathis
ATTORNEYS

United States Patent Office 3,525,884
Patented Aug. 25, 1970

3,525,884

ELECTROMECHANICAL VIBRATING DEVICES

Morio Onoe and Takeshi Yano, Tokyo, Japan, assignors to Nippon Electric Company, Limited, Tokyo, Japan Filed Dec. 23, 1968, Ser. No. 786,173
Claims priority, application Japan, Dec. 28, 1967, 43/84,478
Int. Cl. H01v 7/00
U.S. Cl. 310—8.2 21 Claims

ABSTRACT OF THE DISCLOSURE

Electromechanical vibrating devices exhibiting the characteristics of a passive electrical circuit are provided in accordance with this invention wherein the coupling relationship maintained among various vibrating members therein is relied upon to provide a plurality of recognized circuit functions. In one embodiment of this invention, tuning fork means having a selected resonant frequency is coupled to flexuously vibrating means. The tuning fork means and the flexuously vibrating means are adapted to vibrate along axes which are mutually transverse and each may be independently driven into vibration by electrical signals transduced into mechanical forces or alternatively acts as output means for mechanical vibrations which are transduced into electrical signals. Accordingly, the embodiment of the present invention acts as a reversible four-terminal network.

Figure 1:
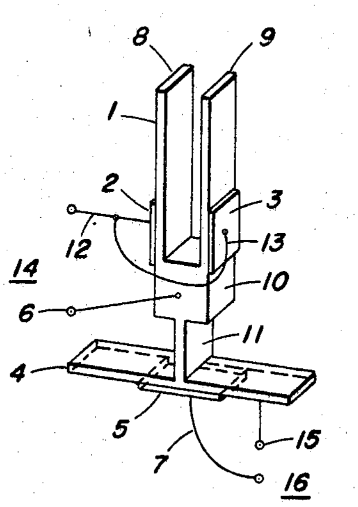
Figure 2:
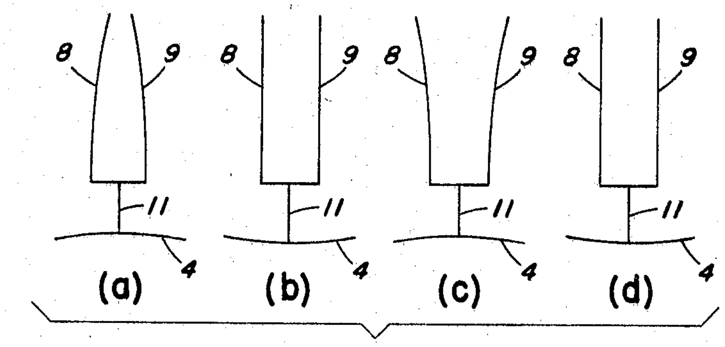

This invention relates to vibrating devices and more particularly to electromechanical vibrating devices which include mechanically coupled vibrating means to provide passive electrical circuit means.

Although vibrating devices of the electromechanical variety have often been relied upon in electrical rectifying circuits, D.C. to A.C. convertor circuits and various metering and switching applications, it is rare that the unique low frequency attributes of such devices have been otherwise utilized to provide recognized circuit functions. Experimental work conducted in the area of technology occupied by electromechanical vibrating devices has, however, indicated that specialized forms of such electromechanical vibrating devices, which include mechanically coupled vibrating means, may be relied upon to act directly as passive circuit means and hence provide a plurality of recognized circuit functions. Accordingly, this invention is drawn to electromechanical vibrating devices which may find widely diversified areas of application where operation capabilities at relatively low frequencies are desired. Such areas of application could include, for instance, nonlinear passive circuit means in amplifier apparatus, frequency convertor apparatus, and digital storage and logic circuits. In addition, electromechanical vibrating devices, as taught by this invention, may act as low power, reversible frequency selective four-terminal network means whose output is phase coded and thus may be utilized either as a 2:1 frequency divider whose performance is similar to a parametron or is a frequency doubler.

Therefore, it is an object of this invention to provide a novel form of an electromechanical vibrating device which includes coupled vibrating means.

It is an additional object of this invention to provide an electromechanical vibrating device that is operative at relatively low frequencies to perform the functions of nonlinear passive circuit means.

It is another object of this invention to provide an electromechanical vibrating device containing a high efficiency coupling between the vibrating means which reside therein.

It is a further object of this invention to provide an electromechanical vibrating device that functions as a reversible four-terminal network which may be utilized as either 2:1 frequency divider means whose output is phase coded or as frequency doubler means.

It is still a further object of this invention to provide an electromechanical vibrating device wherein one vibrating portion thereof includes at least two tines which vibrate in a symmetrical mode.

It is another object of this invention to provide an electromechanical vibrating device wherein the vibratory portion thereof includes at least two tines, each of said tines having a commonly positioned end portion terminating in a yoking member, said yoking member exhibiting sufficient mechanical stiffness to prevent any noticeable stress from being produced in said yoking member to thereby accurately transmit the vibration frequencies generated by said tines.

It is a further object of this invention to provide an electromechanical vibrating device wherein the input and output means thereto are reversible.

It is still another object of this invention to provide an electromechanical vibrating device which is frequency selective and does not require substantial amounts of power so that such a device is particularly useful in frequency selective amplifiers and additionally overcomes primary operating disadvantages of parametrons.

Other objects and advantages of the invention will become clear from the following detailed description of an embodiment thereof, and the novel features will be particularly pointed out in conjunction with the appended claims.

In accordance with this invention, an electromechanical vibrating device capable of acting as passive circuit means at relatively low frequencies is provided wherein electrical signals are utilized to drive vibrating means present therein into oscillation and said vibrating means are mechanically coupled to other vibrating means present therein whereby an electrical output may be derived therefrom.

Figure 3:
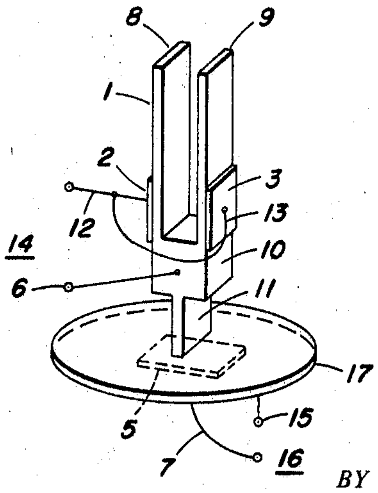

The invention will be more clearly understood by reference to the following detailed description of several embodiments thereof in conjunction with the accompanying drawings in which:

FIG. 1 is a pictorial view of a first embodiment of an electromechanical vibrating device in accordance with the present invention;

FIGS. 2*a*–2*d* illustrate the oscillatory behavior of the embodiment of this invention depicted in FIG. 1; and FIG. 3 is a pictorial view of another embodiment of an electromechanical vibrating device in accordance with the present invention.

Referring now to the drawings and more particularly to FIG. 1 thereof, there is shown a first embodiment of an electromechanical vibrating device according to the present invention. As shown in FIG. 1, the illustrated electromechanical vibrating device comprises a first vibrating means which may take the form of tuning fork means 1, a pair of electromechanical transducer means 2 and 3, a second vibrating means in the form of a flexuously vibrating plate means 4, and an additional electromechanical transducer means 5. The tuning fork means 1, which comprises the first vibrating means, is shown as including two tine portions 8 and 9, yoking member means 10 and shaft means 11. The manner in which the tuning fork means 1 is supported is not shown in FIG. 1; however, as will be apparent to those of ordinary skill in the art, any well known mounting configuration may be utilized so long as the vibrations present in the first and second vibrating means are not impeded. The tuning fork means 1 may be formed as a unitary structure as shown, and may, for the purposes of this explanation, be considered as composed of an iron-nickel alloy. However, it should be clearly understood that other suitable metals, alloys, or appropriately poled ferroelectric materials can readily be used. The two tine portions 8 and 9 each have a free end portion and a second end portion which terminates in the yoking member means 10. The yoking member 10 is structured to exhibit sufficient mechanical stiffness to prevent any noticeable stress from being produced therein and thus will function to accurately transmit the vibration frequencies generated by said tine portions 8 and 9.

Each of the two tine portions 8 and 9 of the tuning fork means 1 has one of the pair of electromechanical transducer means 2 and 3, respectively, securely mounted at a suitable height and position thereon so that the two tine portions 8 and 9 may vibrate at their natural frequency. In FIG. 1, the pair of electromechanical transducer means 2 and 3 have been illustrated as mounted on the outwardly facing surfaces of the two tine portions 8 and 9 respectively; however, as will be manifest to those of ordinary skill in the art, the pair of electromechanical transducer means 2 and 3 may be mounted at any appropriate position on the tines so long as the two tine portions 8 and 9 can vibrate at their natural frequency. The pair of electromechanical transducer means 2 and 3 may, in the instant embodiment, be formed of ferroelectric ceramic material; however, various other piezoelectric, electrostatic, electromagnetic or magnetostrictive materials may be used therefor. The pair of electromechanical transducer means 2 and 3 are each suitably polarized and symmetricallly mounted on the two tine portions 8 and 9, respectively, so that their axes of polarization are parallel, but oppositely directed, thereby insuring that the tine portions 8 and 9 will oscillate in the symmetrical mode, described with regard to FIG. 2, wherein said two tine portion 8 and 9 are either moving toward or away from each other. The pair of electromechanical transducer means 2 and 3 may take the shape of thin rectangular plates, as shown, or other convenient geometric configurations may be used. An electrode 12 or 13, which may be formed of silver, is baked or similarly affixed to each of the electromechanical transducer means 2 or 3, respectively. The electrodes 12 and 13 are interconnected as illustrated and serve in combination with terminal 6 as the input or output terminal means 14 for the pair of electromechanical transducer means 2 and 3.

A flexuously vibrating plate means 4 is formed at the lower end of the shaft means 11 of the tuning fork means 1. The function of the flexuously vibrating plate means 4 is to receive and oscillate at the frequency of the vibration component which predominates in the shaft means 11. Accordingly, the flexuously vibrating plate means 4 is mounted transverse to the axis of the shaft means 11 and may either be unitarily formed with the tuning fork means 1, as shown in FIG. 1, or may be separately formed and bonded thereto by welding, soldering or other bonding techniques well known to those of ordinary skill in the art. As the flexuously vibrating plate means 4 shown in the illustrative embodiment of FIG. 1 is formed as a unitary structure with the tuning fork means 1, the flexuously vibrating plate means 4 would, in the preferred embodiment, also be made of an iron-nickel alloy. Therefore, it will be seen that a coupled relationship exists between the tuning fork means 1 and the flexuously vibrating plate 4 whereby vibrations present in one portion of the coupled system are transmitted to the other portion thereof coupled thereto.

The electromechanical transducer means 5 is fixedly mounted on the lower surface of the flexuously vibrating plate means 4 and has an electrode 7 formed thereon. The electromechanical transducer means 5 may take the same form and material composition as the electromechanical transducers 2 and 3 specifically described above. The electrode 7, which may again take the form of a silver electrode baked on the electromechanical transducer means 5, serves, in combination with terminal means 15, as the input or output means 16 for the electromechanical transducer means 5.

In the design of the embodiment of the electromechanical device according to this invention, as shown in FIG. 1, the dimensions of the tuning fork means 1 are selected so that the natural frequency of oscillation of the two tine portions 8 and 9 thereof is approximately equal to the frequency of the electrical signals applied to terminals 14 or, alternatively, if terminals 16 are to act as the input terminals to the device, one-half the frequency of the electrical signals applied thereto. Thereafter, the natural frequency of the two tine portions 8 and 9 may be precisely adjusted for the requisite natural frequency of oscillation, as set forth above, by such well-known techniques as removing material from the top surfaces of the tine portions 8 and 9 or constraining the oscillation of such tine portions 8 and 9 with weights appropriately affixed thereto.

In the description of the operation of the embodiment of the electromechanical vibrating device depicted in FIG. 1, it will initially be assumed that it is desired to operate the illustrated device in the frequency doubling mode wherein terminals 14 receive input energy and terminals 16 act as output terminals. Accordingly, in the frequency doubling mode of operation, input energy in the form of an alternating electrical signal is applied to terminals 14 which connect to electrodes 12 and 13 formed on the pair of electromechanical transducer means 2 and 3, respectively, and the common terminal formed on the body of the tuning fork means 1. The electrical energy thus applied to the electromechanical transducer means 2 and 3 by their associated electrodes 12 and 13, respectively, will be transduced thereby into mechanical forces in the manner well known to those of ordinary skill in the art. As the frequency of the electrical signals applied to the electrical, mechanical transducer means 2 and 3 is equal to the natural frequency of the tuning fork means 1, the forces generated by the electrical, mechanical transducer means 2 and 3 will cause the two tine portions 8 and 9 of the tuning fork means 1 to oscillate at their natural frequency. Furthermore, as the axis of polarization of each of the electromechanical transducer means 2 and 3 are parallel but oppositely directed, the forces generated by each of the electromechanical transducer means will be 180° out of phase with each other at a given instant of time whereby the two tine portions 8 and 9 of the tuning fork means 1 will oscillate in the symmetrical mode such that the tine portions 8 and 9 constantly move toward or away from each other. The manner in which the tine portions oscillate as well as the manner in which such oscillations, in the form of mechanical vibrations, are coupled to the flexuously vibrating plate means 4 is illustrated in FIGS. *2a–2d*.

FIGS. *2a–2d* are illustrative of the oscillatory behavior of the embodiment of the invention depicted in FIG. 1 wherein each of these figures indicates the condition of the tuning fork means 1 and the flexously vibrating plate means 4 in quadrature and in opposite phase relations to each other in the respective oscillation periods. As shown in FIG. 2*a*, at the instant of time when the two tines 8 and 9 are in the portion of the oscillation period wherein they are at their extreme inward position, the level of the free ends of the two tines 8 and 9 will be lower than when they are in a vertical condition as indicated in FIG. 2*b*. Accordingly, in order that the position of the center of mass or gravity of the structure depicted in FIG. 2*a* remains constant, as required by the law of conservation of momentum, the lower portion of the structure which resides below the two tine portions 8 and 9 must move upward. Therefore, as is shown in FIG. 2*a*, the flexuously vibrating plate means 4 will move upward thereby tending to bow in the center as indicated.

When the two tine portions 8 and 9 are in the portion of their oscillation period wherein they are in their vertical position, as shown in FIG. 2*b*, the level of the free end of such tine portions 8 and 9 will return substantially to their initial position. Thus, in this case as the position of the center of mass must be maintained in its initial condition, the flexuously vibrating plate means 4 must move downward to its initial position as shown. Thus, it will be seen that during one-half cycle of the oscillation period of the tine portions 8 and 9, the flexuously vibrating plate means 4 has moved upward and returned to its initial position, thereby completing one oscillation cycle.

As shown in FIG. 2*c*, at the instant of time when the two tine portions 8 and 9 are in the portion of their oscillation period wherein they are at their extreme outward positions, the level of the free ends thereof is again at a lower position than when the two tine portions 8 and 9 are in their vertical condition. Accordingly, the maintenance of the center of mass in a constant position again requires the lower portion of the structure which resides below the two tine portions 8 and 9 to move upward. Thus, as shown in FIG. 2*c*, the flexuously vibrating plate means 4 will again move upward thereby tending to bow in the center as indicated. When the two tine portions 8 and 9 are in the last portion of their oscillation period wherein they are again in their vertical position, as shown in FIG. 2*d*, the level of the free ends thereof again assume their initial position whereby the flexuously vibrating plate means 4 returns to its initial downward position as explained with regard to FIG. 2*b*. Thus, in the second half of the oscillation cycle of the two tine portions 8 and 9, the flexuously moving plate means 4 has moved upward and returned to its initial condition in the downward position. Therefore, it will be seen that the flexuously vibrating plate means 4 coupled to the tuning fork means 1 completes two cycles of oscillation for each oscillation cycle of the two tine portions 8 and 9 of the tuning fork means 1.

Returning now to FIG. 1, the upward and downward vibration of the flexuously vibrating plate means 4, induced therein by the oscillation of the coupled tine portions 8 and 9 as aforesaid, will be received by the electromechanical transducer means 5 in mechanical communication with said flexuously vibrating plate means 4. As mechanical forces are received by said electromechanical transducer means 5, said electromechanical transducer means 5 will act in the well-known manner to transduce such mechanical forces into electrical signals and present the same at terminals 16 connected to the electrode 7 thereof and electrode 15 which is connected to the body of the flexuously vibrating plate means 4. Thus, as the vibrations of the flexuously vibrating plate means 4 are at twice the frequency of the natural oscillation frequency of the tine portions 8 and 9 of the tuning fork means 1, the output signals present at terminals 16 will be equal to twice the frequency of the electrical signals applied to terminals 14. Accordingly, it will be seen that in the embodiment of this invention, depicted in FIG. 1, when the terminals 14 are utilized as input terminals and the terminals 16 act as output terminals, the illustrated electromechanical vibrating device performs the well-known circuit function of frequency doubler means.

Since each of the electromechanical transducer means 2, 3 and 5 illustrated in FIG. 1 are readily reversible, whereby an electrical signal applied will cause a mechanical force to be produced therefrom and an applied mechanical force will cause an electrical signal to be generated, the input and output connections previously explained may be reversed to obtain another form of operation. Accordingly, if electrical signals having a frequency equal to twice the natural frequency of the tuning fork means 1 are applied to terminals 16, the forces generated thereby will cause the flexuously vibrating plate means 4 to vibrate at the same frequency as said applied electrical signals. From the discussion of FIG. 2 set forth above, it may readily be appreciated that the vibration of the flexuously vibrating plate means 4 will induce oscillations in the tine portions 8 and 9 coupled thereto, equal to one-half the frequency of said flexuously vibrating plate means 4. Furthermore, as the electrical signals applied to terminals 16 are selected to be equal to twice the natural resonant frequency of said tuning fork means 1, such one-half frequency oscillations will be equal to the natural frequency of said tuning fork means 1. The vibrations of the tine portions 8 and 9 under these circumstances will induce forces in the pair of electromechanical transducer means 2 and 3, respectively, connected to each tine portion 8 or 9 and these forces will be transduced into electrical signals in the well-known manner. Thus, it will be seen that electrical signals equal to one-half the frequency of the input electrical signals applied at terminals 16 will be present at the now output terminals 14 whereby, in this mode of operation, the electromechanical vibrating device depicted in FIG. 1 acts to perform the well-known function of 2:1 frequency divider means.

In addition, because the time portions 8 and 9 of the tuning fork means 1 are oscillating at their natural frequency, the phase thereof wil be maintained constant until the oscillation thereof is stopped. Thereafter, if the tine portions 8 and 9 of the tuning fork means 1 are again caused to oscillate the phase of the newly initiated oscillations may be equal or opposite to the phase relationsip of the previously terminated operating cycle. Thus, it will be seen that even though the initial phase established is fortuitous, once one of the two possible phases, i.e., where the tine portions initially move inwardly or outwardly, is established, the phase of the oscillations of the tine portions 8 and 9 will persist until the input signals applied to terminals 16 are terminated. Accordingly, as the input signals applied to terminals 16 may be likened to the pump frequency present in a parametron, since such pump signals are also twice the frequency of the output frequency of a parametron, and an initial phase relationship established in the output signal persists until the output is terminated, as is also the case in a parametron; if the initial phase of the oscillations of the tine portions 8 and 9 can be controlled, the operating characteristics of the electromechanical vibration device depicted in FIG. 1 will be functionally the same as a parametron. This may here be accomplished by initiating or seeding the initial oscillating cycles of the tine portions 8 and 9 of the tuning fork means 1 with a low amplitude A.C. signal, having the requisite directivity, applied to the output terminals 14. The proper phase relationship is thus developed in the tine portions 8 and 9 and thereafter the normal input signal is applied to input terminals 16 to build up the oscillations of the tine portions 8 and 9, as initially established, whereby the properly phased oscillation of the tine portions 8 and 9 will be maintained and produced in the form of constant phase output signals at output terminals 14. Accordingly, as one of two possible phases are selectable for the output signals present at terminals 14 by a seeding technique similar to that used in parametrons, binary information may be stored in the embodiment of the electromechanical vibration device depicted in FIG. 1 by relying upon the phase coded output thereof as is presently done in parametrons. Additionally, as will be apparent to those of ordinary skill in the art, binary logic functions may be performed by the electromechanical vibrating device depicted in FIG. 1 in the same manner as in parametric devices. Therefore, the embodiment of the vibration device depicted in FIG. 1 may be used as a binary storage or logic element which functions in the same manner as a parametron while not requiring the large power requirements thereof. Furthermore, the embodiment of the invention depicted in FIG. 1, acting as a nonlinear circuit element, may be used to replace the conventional intermittent operation oscillator in a super regenerative amplifier circuit to thereby obtain an amplifier with sharp frequency selective properties which has heretofore been unavailable where parametrons were used.

FIG. 3 is a pictorial view of another embodiment of an electromechanical vibrating device in accordance with the teachings of the present invention. The FIG. 3 embodiment of an electromechanical vibrating device according to this invention represents a modification of the FIG. 1 embodiment of this invention in that a flexously vibrating plate means 17 in the shape of a circular disc has been substituted for the rectangular member of FIG. 1. Accordingly, as the remainder of the structure depicted in FIG. 3 may be precisely the same as that described in conjunction with FIG. 1, like reference numerals have been retained where applicable to identify common structure. Furthermore, as the various modes of operation of the FIG. 3 and FIG. 1 embodiments of this invention are the same, the structure mounting configuration and operation of the electromechanical vibrating device of FIG. 3 may be fully understood by appropriate reference to the explanation of the FIG. 1 embodiment given above and will not be reiterated here. However, it should be noticed that the flexuously vibrating plate means 17 in the shape of a circular disc, relied upon in the FIG. 3 embodiment, will under certain conditions prove to be preferable to the rectangular means utilized in the FIG. 1 embodiment because, as will be apparent to those of ordinary skill in the art, the electromechanical conversion efficiency of a flexuously vibrating plate means having the configuration illustrated in FIG. 3 will be superior to that manifested by a rectangular flexuously vibrating plate means such as that shown in FIG. 1. Again, the flexuously vibrating plate means 17 illustrated in FIG. 3 may be formed as a unitary portion of the tuning fork means 1 or alternatively bonded thereto by any of the well-known bonding techniques mentioned above. Thus, it will be seen that a second embodiment of an electromechanical vibrating device in accordance with the teachings of this invention has been set forth in conjunction with FIG. 3.

Although the reversible frequency selective four-terminal network means provided by the electromechanical vibrating device according to this invention has been specifically described in regard to embodiments wherein the electromechanical transducer means and the various vibrating means constitute independent means in mechanical communication, it will be apparent to those of ordinary skill in the art, that this independent relationship need not be maintained in the creation of an electromechanical vibrating device in accordance with the teachings of the instant invention. Accordingly, the coupled vibrating means may be formed directly of transducer material, such as a suitably poled ferroelectric ceramic, having metallic electrodes integrated therein in a manner to maintain the symmetry of the various vibrating members, whereby the respective vibrating members may constitute both the coupled vibrating members and the electromechanical transducer means described above.

Furthermore, although the invention has been disclosed in conjunction with embodiments wherein the electromechanical transducer means were indicated as being preferably formed of ferroelectric material, it will be obvious to those of ordinary skill in the art, that electromagnetic, magnetostrictive, electrostatic or other piezoelectric materials may be used with only minor modifications to the illustrated structure.

While the invention has been described in connection with several exemplary embodiments thereof, it will be understood that many modifications will be readily apparent to those of ordinary skill in the art; and that this application is intended to cover any adaptations or variations thereof. Therefore, it is manifestly intended that this invention be only limited by the claims and the equivalents thereof.

What is claimed is:

1. An electromechanical vibrating device comprising:

first vibrating means having a select resonant frequency of oscillation;

second vibrating means in a coupled relationship with said first vibrating means and adapted to vibrate in a direction which is substantially transverse to the direction of vibration of said first vibrating means, said coupled relationship providing for the coupling of vibrations present in one of said vibrating means to another of said vibrating means and establishing a coupling ratio therebetween which is greater than one;

first means adapted to receive electrical energy and in response thereto cause vibrations to occur in one of said vibrating means, said first means being connected to one of said vibrating means; and second means connected to another of said vibrating means and adapted to provide electrical output signals representative of vibrations present in said another of said vibrating means.

2. The device according to claim 1 wherein said first vibrating means includes at least two tine portions, each of said at least two tine portions having one portion thereof which is free to vibrate and a second portion thereof coupled to said second vibrating means.

3. The device of claim 2 wherein one of said first and second means comprises a pair electromechanical transducer means, each of said pair of electromechanical transducer means being affixed to one of said tine portions so as to be in mechanical communication therewith.

4. The device of claim 3 wherein said pair of electromechanical transducer means are orientated on said tine portions with their axes of polarization parallel but oppositely directed whereby said tines oscillate in a symmetrical mode.

5. The device of claim 4 wherein another of said first and second means comprises an additional electromechanical transducer means, said additional electromechanical transducer means being affixed to said second vibrating means so as to be in mechanical communication therewith.

6. The device of claim 5 wherein each of said pair of electromechanical transducer means and said additional electromechanical transducer means comprise reversible input/output means for said electromechanical vibrating device.

7. The device of claim 6 wherein said coupled relationship establishes a coupling ratio between said first and second vibrating means of 2:1.

8. The device of claim 7 wherein said second vibrating means comprises rectangular plate means.

9. The device of claim 6 wherein said second vibrating means comprises circular disc means.

10. The device of claim 1 wherein said first vibrating means includes tuning fork means including at least two tine portions, yoking member means and shaft member means, each of said at least two tine portions having one portion thereof which is free to vibrate and a second portion thereof coupled to said second vibrating means through said yoking member means and said shaft member means.

11. The device of claim 10 wherein one of said first and second means comprises a pair of electromechanical transducer means, each of said pair of electromechanical transducer means being affixed to one of said tine portions so as to be in mechanical communication therewith.

12. The device of claim 11 wherein said pair of electromechanical transducer means are orientated on said tine portions with their axes of polarization parallel but oppositely directed whereby said tines oscillate in a symmetrical mode.

13. The device of claim 12 wherein another of said first and second means comprises an additional electromechanical transducer means, said additional electromechanical transducer means being affixed to said second vibrating means so as to be in mechanical communication therewith.

14. The device of claim 13 wherein each of said pair of electromechanical transducer means and said additional electromechanical transducer means comprise reversible input/output means for said electromechanical vibrating device.

15. The device of claim 14 wherein said coupled relationship establishes a coupling ratio between said first and second vibrating means of 2:1.

16. The device according to claim 15 wherein said first means comprises said pair of electromechanical transducer means in said mechanical communication with said two tine portions whereby said electromechanical transducer means acts as frequency doubler means.

17. The device of claim 15 wherein said second vibrating means comprises rectangular plate means.

18. The device of claim 15 wherein said first means comprises said additional electromechanical transducer means affixed to said second vibrating means whereby said electromechanical transducer means act as a frequency divider means.

19. The device of claim 18 additionally comprising seeding means adapted to establish either one of two select modes of oscillation for said tine portions of said tuning fork means.

20. The device of claim 19 wherein said two select modes of oscillation comprise two distinct phases of oscillation which are 180° out of phase and accordingly may represent different binary conditions.

21. The device of claim 20 wherein said second vibrating means comprises a unitary portion of said tuning fork means.

References Cited

UNITED STATES PATENTS

| | | | |
|---|---|---|---|
| 3,106,124 | 10/1963 | Asten | 310—25 XR |
| 1,913,331 | 6/1933 | Buckingham | 331—156 XR |
| 3,441,753 | 4/1969 | Tebayama | 310—8.2 |
| 3,435,260 | 3/1969 | Seidel | 310—8.3 |
| 2,513,340 | 7/1950 | Lyman. | |
| 3,024,429 | 3/1962 | Cavalieri et al. | 331—156 XR |
| 3,425,310 | 2/1969 | Grib et al. | 84—457 |
| 2,861,256 | 11/1958 | Hart | 58—23 |
| 1,906,985 | 5/1933 | Marrison | 84—409 |
| 3,354,413 | 11/1967 | Ko | 333—72 |

FOREIGN PATENTS

| | | |
|---|---|---|
| 36,575 | 1925 | Denmark. |
| 1,507,948 | 11/1967 | France. |
| 1,380,257 | 10/1964 | France. |

WARREN E. RAY, Primary Examiner

B. A. REYNOLDS, Assistant Examiner

U.S. Cl. X.R.

84—409; 310—8.5, 25; 333—71